United States Patent [19]
Grubb et al.

[11] Patent Number: 6,151,338
[45] Date of Patent: Nov. 21, 2000

[54] HIGH POWER LASER OPTICAL AMPLIFIER SYSTEM

[75] Inventors: Stephen G. Grubb, Fremont; David F. Welch, Menlo Park; Raymond Zanoni, Fremont, all of Calif.

[73] Assignee: SDL, Inc., San Jose, Calif.

[21] Appl. No.: 08/819,950

[22] Filed: Mar. 18, 1997

Related U.S. Application Data

[60] Provisional application No. 60/038,437, Feb. 19, 1997.

[51] Int. Cl.⁷ ........................................................ H01S 3/30
[52] U.S. Cl. ................................................................ 372/6
[58] Field of Search .................................. 372/6; 359/177, 359/179, 341

[56] References Cited

U.S. PATENT DOCUMENTS

| | | | |
|---|---|---|---|
| 4,964,242 | 10/1990 | Ruble et al. | 51/144 |
| 5,062,021 | 10/1991 | Ranjan et al. | 360/135 |
| 5,088,240 | 2/1992 | Ruble et al. | 51/165 |
| 5,099,615 | 3/1992 | Ruble et al. | 51/165 |
| 5,136,600 | 8/1992 | Fidric et al. | 372/6 |
| 5,162,073 | 11/1992 | Aronoff et al. | 156/625 |
| 5,167,096 | 12/1992 | Eltoukhy et al. | 51/281 |
| 5,236,763 | 8/1993 | Luthi | 428/156 |
| 5,311,603 | 5/1994 | Fidric | 372/6 |
| 5,313,480 | 5/1994 | Fidric et al. | 372/6 |
| 5,385,092 | 1/1995 | Lewis et al. | 101/467 |
| 5,528,922 | 6/1996 | Baumgart et al. | 73/1 J |
| 5,532,864 | 7/1996 | Alexander et al. | 372/6 |
| 5,533,040 | 7/1996 | Zhang | 372/25 |
| 5,541,947 | 7/1996 | Mourou et al. | 372/372 |
| 5,550,696 | 8/1996 | Nguyen | 360/135 |
| 5,567,484 | 10/1996 | Baumgart et al. | 427/555 |
| 5,576,918 | 11/1996 | Bar-Gadda et al. | 360/135 |
| 5,696,782 | 12/1997 | Harter et al. | 372/70 |

FOREIGN PATENT DOCUMENTS

| | | |
|---|---|---|
| 0 685 946 A1 | 12/1995 | European Pat. Off. . |
| 0 729 207 | 8/1996 | European Pat. Off. . |
| WO 86 02301 | 4/1986 | WIPO . |

OTHER PUBLICATIONS

D. Taverner et al., "158 muJ pulses from a single transverse mode large area erbium doped fiber amplifier", *Optics Letters*, vol. 22, No. 6, Mar. 15, 1997, Washington.

B. Desthieux et al., "111 KW (0.5mJ) pulse amplification at 1.4 mum using a gated cascade of three erbium doped fiber amplifiers" Applied Physics Letters, vol. 63, No. 5, Aug. 2, 1993, New York, US.

Minelly J.D. et al., "Femtosecond Pulse Amplification in Cladding–pumped FIbers" *Optics Letters*, vol. 20., No. 17, Sep. 1, 1995.

Galvanauskas et al., "High–power Amplification of Femtosecond Optical Pulses in a Diode–pumped Fiber System" *Optics Letters*, vol. 19, No. 16, Aug. 15, 1994.

*Primary Examiner*—James W. Davie
*Assistant Examiner*—Robert E. Wise
*Attorney, Agent, or Firm*—W. Douglas Carothers, Jr.

[57] ABSTRACT

A high power laser optical amplifier system for material processing comprises multiple stage fiber amplifiers with rejection of propagating ASE buildup in and between the amplifier stages as well as elimination of SBS noise providing output powers in the range of about 10 $\mu$J to about 100 $\mu$J or more. The system is driven with a time varying drive signal from a modulated semiconductor laser signal source to produce an optical output allowing modification of the material while controlling its thermal sensitivity by varying pulse shapes or pulse widths supplied at a desire repetition rate via modulation of a semiconductor laser signal source to the system to precisely control the applied power application of the beam relative to the thermal sensitivity of the material to be processed. The high power fiber amplifier system has particular utility in high power applications requiring process treatment of surfaces, such as polymeric, organic, ceramic and metal surfaces, e.g., material processing, surface texturing, heat treatment, surface engraving, fine micro-machining, surface ablation, cutting, grooving, bump forming, coating, soldering, sealing, surface diffusion and surface conversion to a compound. A particular example is given for texturing of disk surfaces of magnetic disk media prior to the deposition or coating of a thin magnetic film on the textured surfaces to prevent slider stiction.

29 Claims, 6 Drawing Sheets

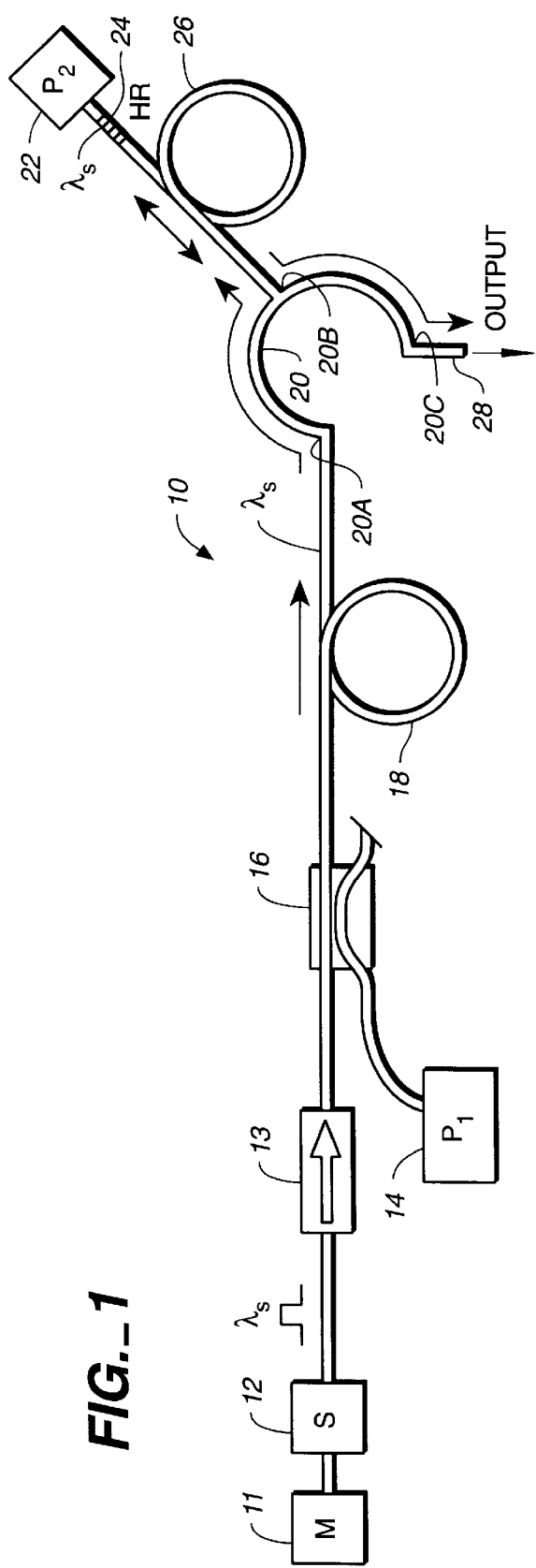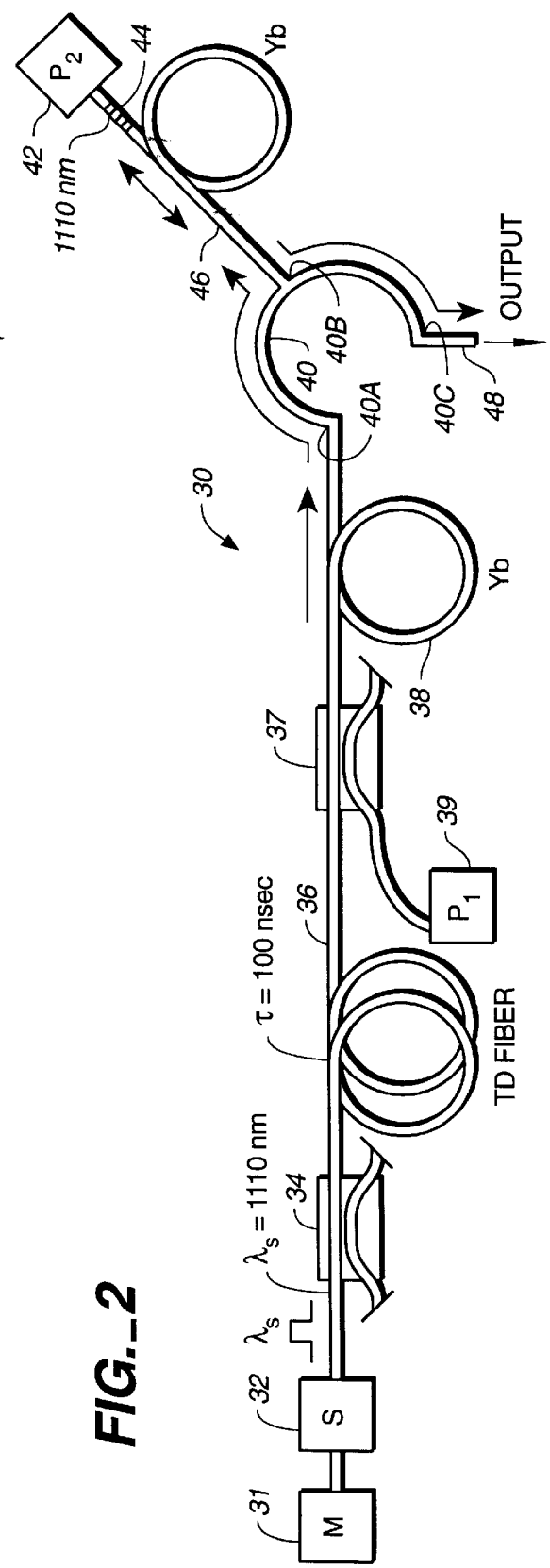

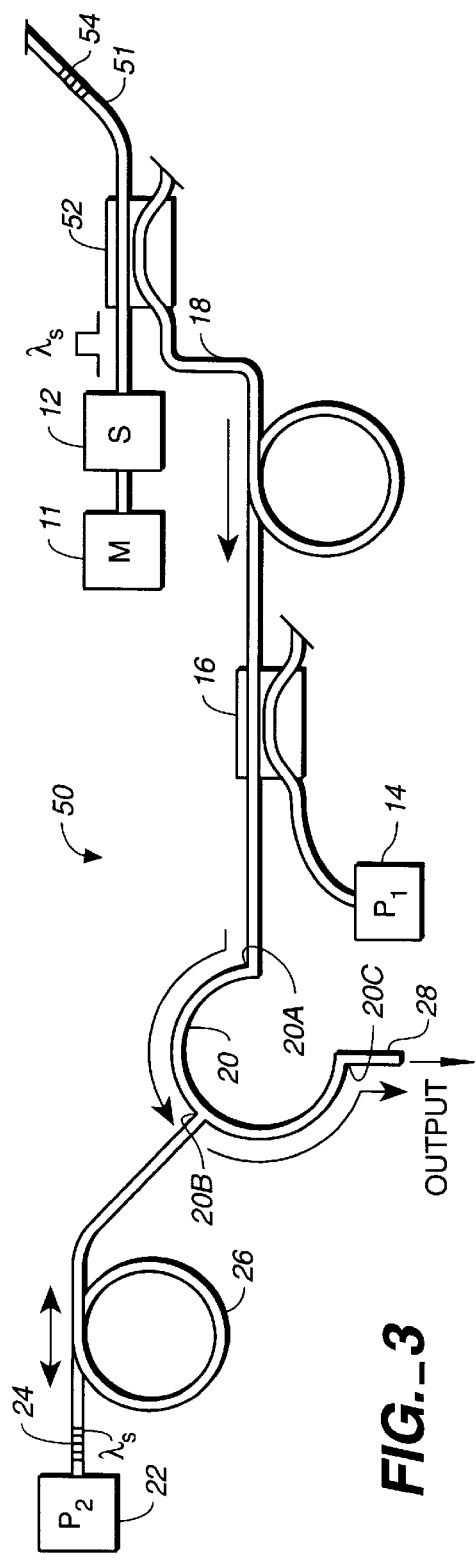
FIG._3
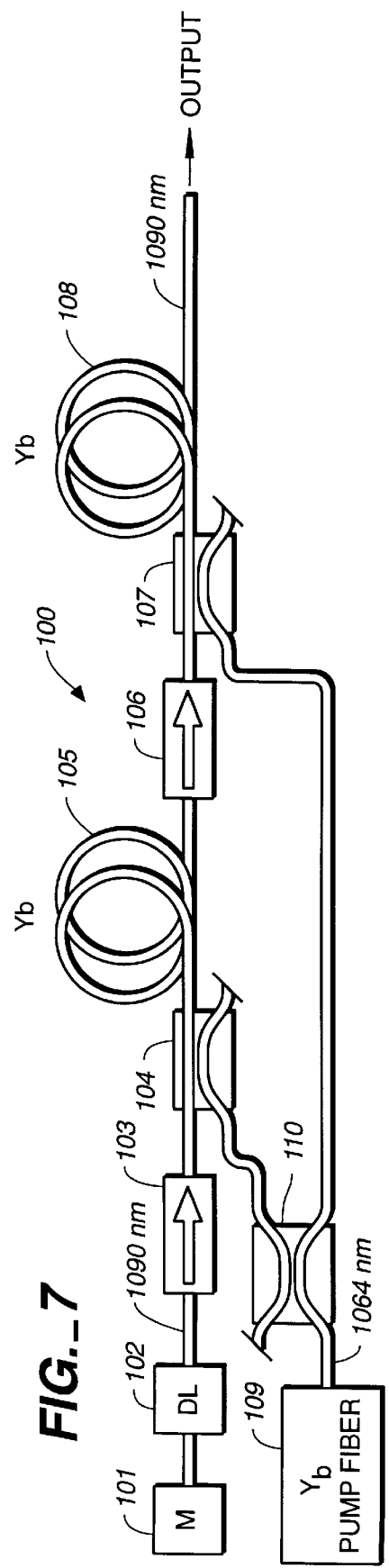
FIG._7

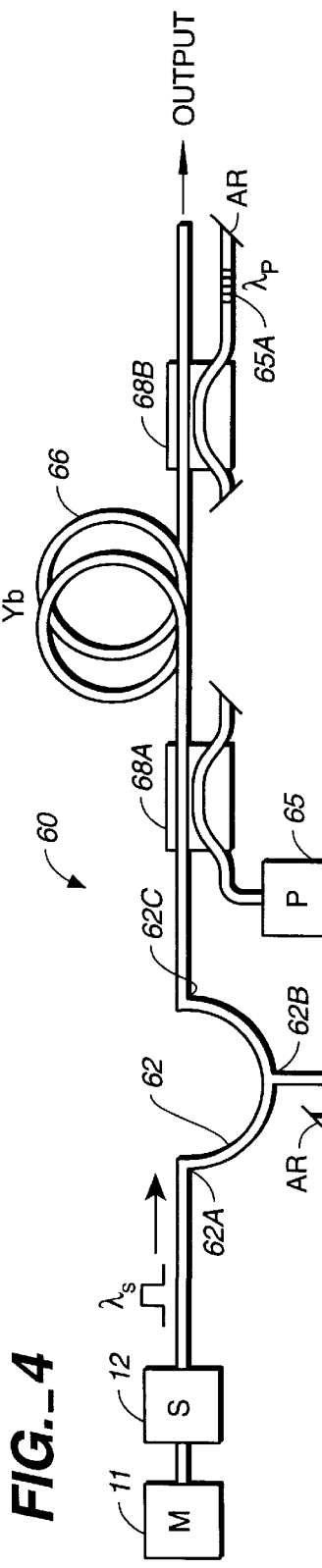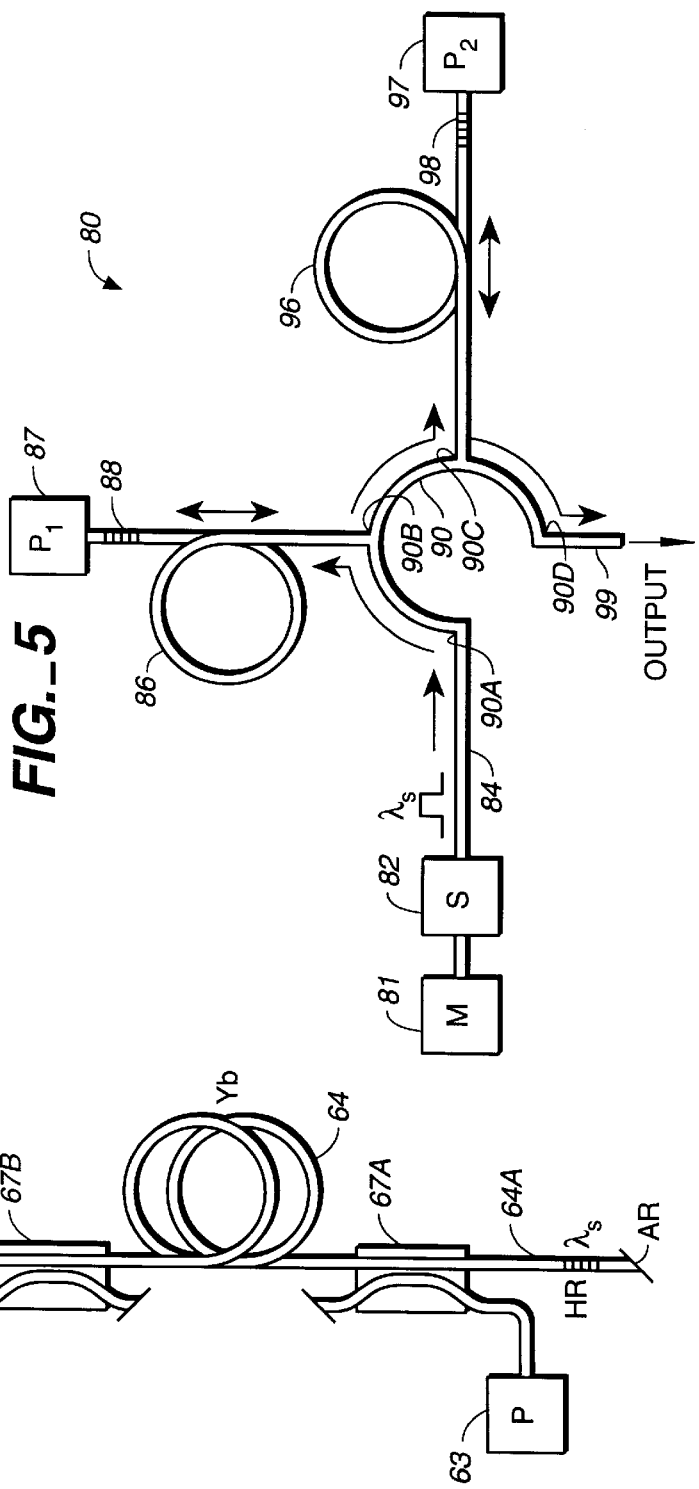
FIG._4
FIG._5

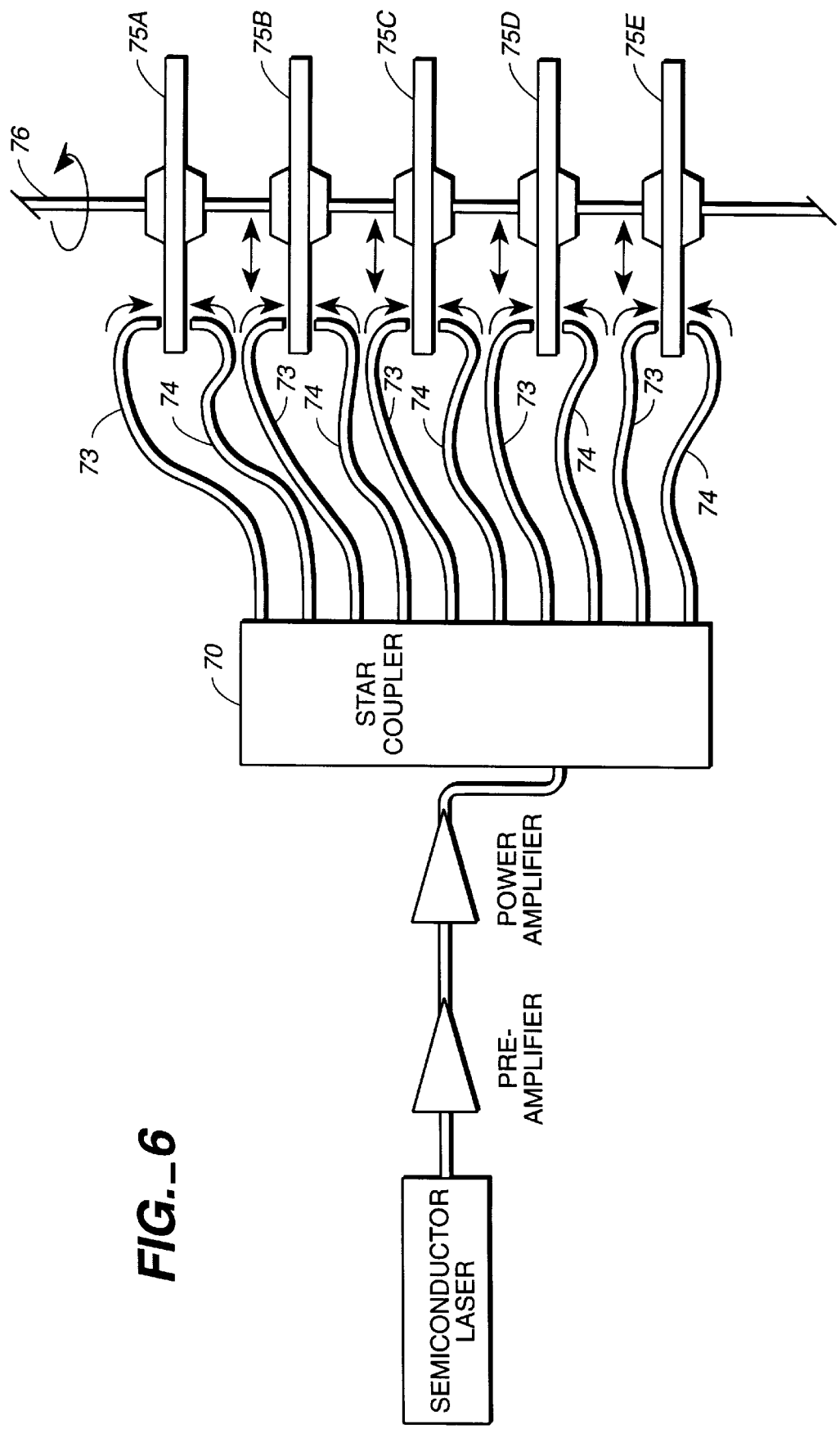
FIG._6

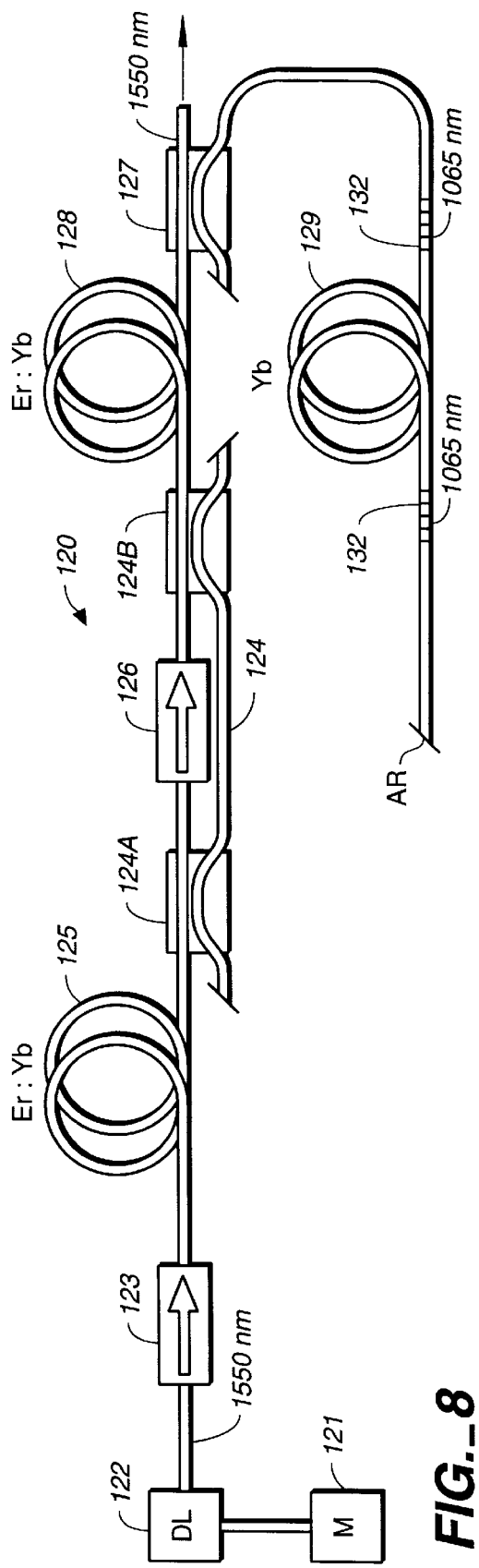
FIG._8
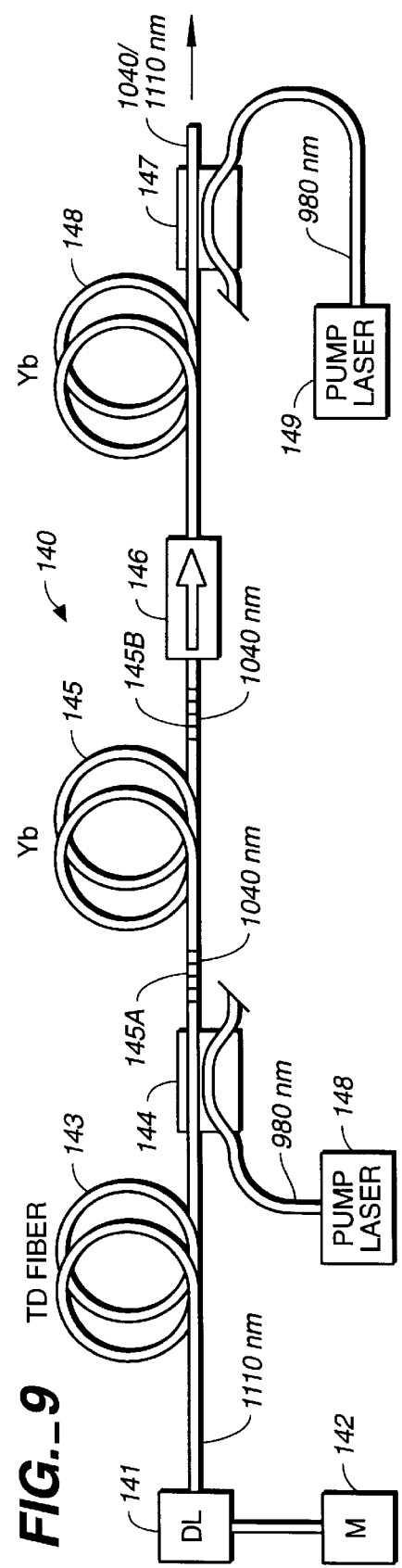
FIG._9

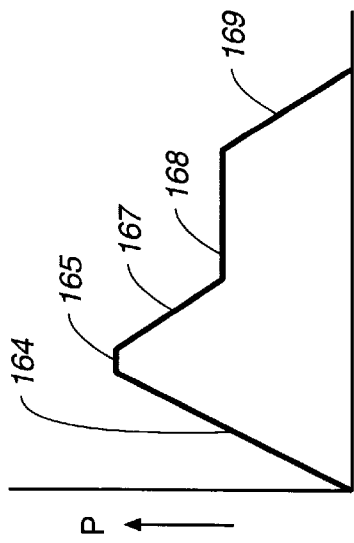
FIG._11
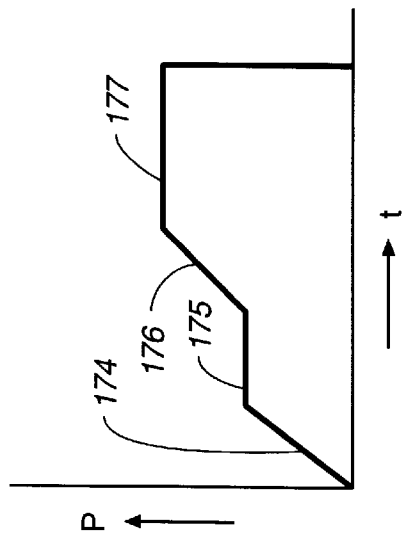
FIG._13
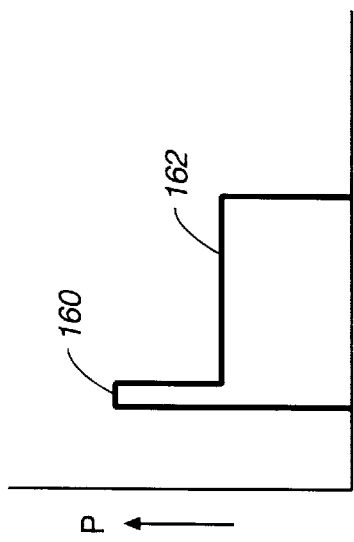
FIG._10
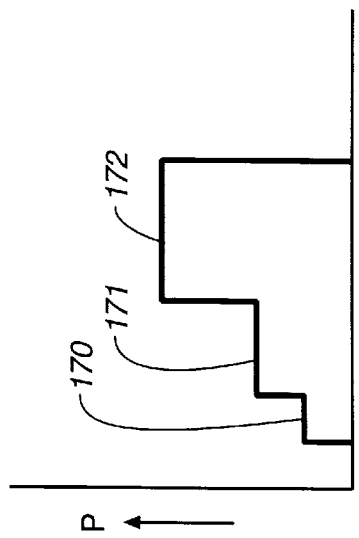
FIG._12

HIGH POWER LASER OPTICAL AMPLIFIER SYSTEM

REFERENCE TO RELATED APPLICATION

This application claims prior benefits of prior filed co-pending provisional application, Ser. No. 60/038,437, filed Feb. 19, 1997, which is incorporated herein by reference.

FIELD OF THE INVENTION

This invention relates generally to pulsed laser, high power optical amplifier system and more particularly to pulsed semiconductor laser high power fiber amplifier systems for material processing such as in the case of thermally treating polymeric, ceramic and metal surfaces, including but not limited to, surface texturing, heat treatment, surface engraving, surface ablation, cutting, grooving, bump forming, coating, sealing, soldering, surface diffusion and surface conversion to a compound. A particular example is shown for surface texturing of disk surfaces, such as for texturing of magnetic disk substrate surfaces upon which is formed a thin magnetic film comprising a magnetic hard disk employed in digital magnetic recording systems.

BACKGROUND OF THE INVENTION

Material processing has been used with Nd:YAG lasers and gas lasers, e.g. $CO_2$ lasers, to process treat polymeric, ceramic and metal surfaces, including but not limited to surface texturing, heat treatment, surface engraving, micro-machining, surface ablation, cutting, grooving, bump forming, coating, sealing, surface diffusion and surface conversion to a compound. One such process example is surface texturing for magnetic disk media used in magnetic disk systems. In present day magnetic disk systems, particularly magnetic rigid disks used for recording data, the surfaces of the disks are textured, i.e., provided with a plurality of microscopic grooves or bumps across or in portions of the disk surfaces to improve the properties of the disk both mechanically and magnetically. Surface texturing mechanically removes the Johansson block effect which is the tendency for flying magnetic, air bearing slider in a magnetic head, employed in magnetic disk drives, to adhere to the flat substrate magnetic surface of a magnetic medium. This is referred to as stiction wherein the air bearing slider has been stationary on the magnetic recording surface for a period of time, the slider resists any transitional movement and is prone to adhere to the magnetic surface. Texturing removes, if not eliminates, such slider adhesion. Also, mechanically, the grooves provide a place or reservoir for loose microscopic materials developed over time to lodge out of the way of the flying head. Magnetically, surface texturing enhances the magnetic surface properties by reducing the magnetic radial component while intensifying the circumferential magnetic component. After surface texturing, a thin magnetic film is formed on the textured disk surfaces. Intermediate layers may be utilized prior to magnetic film formation to improve the adherence and magnetic properties of the film.

In the past, the texturing processing has been carried out using a fixed or free abrasive medium, such as a tape, applied to the surface of the disk substrate. See, for example, U.S. Pat. No. 4,964,242; 5,088,240; and 5,099,615 assigned to Exclusive Design Company, Inc. of San Mateo, Calif.

Texturing also has been accomplished employing a texturing pad in combination with a particle slurry as taught in U.S. Pat. No. 5,167,096. Also, chemical etching has been employed for texturing as disclosed in U.S. Pat. No. 5,576,918. Recently, the use of lasers have been applied for texturing substrate surfaces for magnetic disks. Examples of such laser texturing systems are disclosed in U.S. Pat. Nos. 5,062,021; 5,567,484; 5,550,696; and 5,528,922 for overcoming stiction between the magnetic disk medium and the magnetic head slider when the slider starts and stops relative to the magnetic disk surface or in texturing an outer annular surface of the disk for use in Contact Start/Stop (CSS) cycling of the magnetic head. In most of these cases, a $CO_2$ gas laser or Q-switched Nd:YAG (Nd:YLF or Nd:YVO$_4$) laser having, for example, a wavelength around 1060 nm with a repetitive pulse rate of 70 kHz to 100 kHz and pulse with of about 60 or 70 μsec have been employed. In Q-switched Nd:YAG laser systems, the noise specification is around 2% rms. These laser systems are integrated into a laser texturing head where the output beam is split using waveplates or cubic beam splitters so that the split beam is routed to opposite surfaces of the disk to textured.

However, these systems have no ability for directly providing pulse stability, pulse-to-pulse repeatability as well as selected pulse width and shape configuration. As an example, the pulse width and shape in Q-switched Nd:YAG laser systems cannot be changed on-the-fly in pulse width and pulse shape with time such as double stepped amplitudes or ramp-up and ramp-down variations.

It is a primary object of this invention to provide a pulsed semiconductor laser high power fiber amplifier system for material processing.

It is another object of this invention to provide a modulated diode laser and fiber amplifier system capable of providing 10 mW of pulse input power and produce output powers in hundreds of watts to several kilowatts for material processing applications with very low pulse to pulse energy fluctuations.

Also in laser texturing as a exemplary example of material processing, what is desired is a laser texturing head that is lighter in weight and smaller in size that is not so bulky, compared to the task at hand, and are capable of the same and even higher power delivery for texturing with pulse stability and pulse-to-pulse repeatability, which is another object of this invention.

It is a another object of this invention is to provide a high power laser optical amplifier system of comparatively small compact size for texturing the surfaces of disk substrates employed in magnetic recording systems.

It is further object of this invention to provide a high power laser optical amplifier system that has sufficiently high power to process treat polymeric, ceramic and metal surfaces, including but not limited to, surface texturing, heat treatment, surface engraving, micro-machining, surface ablation, cutting, grooving, bump forming, coating, sealing, soldering, surface diffusion and surface conversion to a compound.

SUMMARY OF THE INVENTION

According to this invention, a pulsed semiconductor laser high power fiber amplifier system for material processing comprises at least one fiber amplifier capable of rejection of propagating ASE buildup in and between the amplifier stages as well as elimination of SBS noise providing output powers in the range of about 10 μJ to about 100 μJ or more resulting in low pulse to pulse energy fluctuations. The system is driven with a time varying drive signal from a modulated semiconductor laser signal source to produce an optical output allowing modification of the material while controlling its thermal sensitivity by varying pulse shapes or pulse widths supplied at a desire repetition rate via modulation of a semiconductor laser signal source to the system to precisely control the applied power application of the beam relative to the thermal sensitivity of the material to be processed.

A pulsed semiconductor laser fiber high power amplifier system of this invention further comprises a semiconductor laser pumped, multi-stage fiber amplifier with means for rejecting amplified stimulated emission (ASE) buildup in and between the amplifier stages which is a problem in achieving higher power outputs in fiber amplifier systems. ASE rejection means utilized in this invention comprises the employment of one or more of an optical circulator, a narrow band WDM, or a dB coupler with peak injection signal gratings at coupler terminal ports. The system may be operated cw or pulsed. The ASE inhibited fiber amplifying system provides a laser source and fiber amplifier system that is capable of providing an amplified modulated pulse output having high long term pulse stability, e.g., below 1% rms, with ability to provide pulse width and pulse contour selectability, not readily capable with YAG systems, and providing a pulse output up to 100 µJ for delivery to an applied application such as in the exemplary application herein of disk texturing. The system with ASE rejection also has high utility for signal modulation and amplification in optical communication systems.

The basic components of the pulsed semiconductor laser high power fiber amplifier system is a laser diode source or diode laser array source, coupled to means to isolate the laser source from feedback noise, which is coupled to a first stage single mode fiber amplifier followed by a second stage double clad fiber amplifier.

Also, the pulsed semiconductor laser high power fiber amplifier system of this invention eliminates problems with SBS by providing a semiconductor laser source having multiple wavelengths to increase the SBS threshold by the number of multimodes present so that the stages of amplification are relatively free of SBS. The multimode output of the laser source may be coupled to a multimode fiber followed by a cladding pump or double clad fiber amplifier. The semiconductor laser source may be operated in multimode by having attached to it a pigtail fiber with a fiber Bragg grating designed to provide optical feedback to the laser that drives the laser into multimode operation.

The pulsed semiconductor laser high power fiber amplifier system of this invention is capable of providing pulse peak powers of about 0.1 kW to about 10 kW with a modulated semiconductor laser as initial input power of about 10 mW with pulse widths of about 10 nsec to about 100 nsec and capable of being modulated at repetition rates between 10 kHz and 1 MHz providing an output power from the system in the range of about 10 µJ to about 100 µJ.

The pulsed semiconductor laser high power fiber amplifier system of this invention is applicable for many applications such as fine micro-machining or surface texturing. In surface texturing of magnetic disk substrates, the system of this invention replaces texturing techniques such as chemical etching employed in the texturing process as set forth in U.S. Pat. No. 5,162,073 or YAG laser systems employed in the texturing process as set forth in U.S. Pat. Nos. 5,062,021; 5,567,484; 5,550,696; and 5,528,922. Also, this invention has excellent utility for engraving surfaces such as ceramic and metal surfaces used in gravure type or ablative off-set printing systems as disclosed in U.S. Pat. Nos. 5,236,763 and 5,385,092, as well as other applications that can successfully employ high amplification of laser diode signal with high rejection of ASE, such as in optical isolators, optical communications and LIDAR.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic view of a first embodiment of a pulsed semiconductor laser high power fiber amplifier system of this invention.

FIG. 2 is a schematic view of a first modified version of the first embodiment of this invention.

FIG. 3 is a schematic view of a second modified version of the first embodiment of this invention.

FIG. 4 is a schematic view of a third modified version of the first embodiment of this invention.

FIG. 5 is a schematic view of a second embodiment of a pulsed semiconductor laser high power fiber amplifier system of this invention.

FIG. 6 is a schematic view of the application of the embodiments of this invention relating to surface texturing of disk substrates.

FIG. 7 is a schematic view of a third embodiment of a pulsed semiconductor laser high power fiber amplifier system of this invention.

FIG. 8 is a schematic view of a fourth embodiment of a pulsed semiconductor laser high power fiber amplifier system of this invention.

FIG. 9 is a schematic view of a fifth embodiment of a pulsed semiconductor laser high power fiber amplifier system of this invention.

FIG. 10 is a first example of a pulse shape capable of the high power laser optical amplifier system of this invention.

FIG. 11 is a second example of another pulse shape capable of being provided by the systems of this invention.

FIG. 12 is a third example of further pulse shape capable of being provided by the systems of this invention.

FIG. 13 is a fourth example of a pulse shape capable of being provided by the systems of this invention.

DETAILED DESCRIPTION OF THE PREFERRED EMBODIMENTS OF THE INVENTION

Reference is now made to FIG. 1 which illustrates a generic form of a first embodiment of this invention. Pulsed semiconductor laser high power fiber amplifier system 10 comprises a fiber pre-amplifier 18 having an optical fiber with a core doped with rare earth active element, e.g., a $Yb^{3+}$ doped amplifier. Signal source 12 may typically be in the range, for example, of 1060 nm to 1120 nm. Signal source 12 may also be a fiber laser source. In any case, source 12 is modulated via modulator and pulse shaper circuit 11 to provide a pulse stream on its output, $\lambda_s$, for input to fiber amplifier 18. Circuit 11 includes electronic circuitry, known to those skilled in the art, to vary the pulse width and pulse shape of the pulse produced by laser source 12. The wavelength of the modulated signal, $\lambda_s$, is within the gain emission spectrum of the rare earth active element in the core of amplifier 18. Pump source 12 for pre-amplifier 18 is typically a semiconductor laser source and is couple to amplifier 18 via WDM coupler 16 to provide a pump input within the absorption emission spectrum of the rare earth active element of the doped core. Pre-amplifier 18 may be a single mode fiber or a double clad fiber (shown here as single mode), and is driven to obtain sufficient average peak power to saturate second stage power amplifier 26.

The output of amplifier 18 is coupled to the input port 20A of a three port optical circulator (OC) 20, which is a commercially available device, and functions as a multiport input/output coupler with optical isolation provided against backwards radiation propagation between ports. Input/output port 20B of OC 20 is coupled to one end of a double pass, high power fiber amplifier 26 comprising an optical fiber having a core doped with rare earth active element, e.g., a $Yb^{3+}$ core doped fiber amplifier. The other end of amplifier 26 is coupled to a high reflector (HR) fiber grating 24 which has a peak reflectivity at wavelength, $\lambda_s$, and rejects ASE buildup in loss through the fiber. Grating 24 prevents the passage of pulses, $\lambda_s$, toward pump laser source 22, which source is employed for pumping amplifier 26 via its pump cladding. Pump source 22 is typically a semiconductor laser diode, but could also be a fiber laser source, and has a wavelength that is transparent to grating 24 but within absorption emission spectrum of fiber amplifier 26. ASE feedback noise toward pump laser source 22 is lost in the fiber and does not affect the operation of the source. Modulated pulse signal, $\lambda_s$, enters amplifier 26 via port 20B and is amplified by the gain of the amplifier after which the signal is reflected by grating 24 back through amplifier 26 where the signal, $\lambda_s$, is again amplified with minimal insertion loss, and exits this branch of OC 20 to OC output port 20C providing a high power pulsed signal on output 28. Backward propagating ASE developed in the second amplifier is blocked from saturating pre-amplifier 18 due to OC optical isolation between the two amplifier stages. Thus, for example, the signal, $\lambda_s$, input at source 12 may be a modulated pulse stream of 10 nsec pulses of an average power of about 10 mW and provide an output 28 pulse stream having a pulse energy level up to about 100 $\mu J$ into first stage amplifier 18 which is highly useful for material processing, such as in the case of welding, cutting, heat treating, fine micro-machining, thermal compound conversion, grooving or texturing of metal and ceramic materials and surfaces.

Also, grating 24, being reflective of the signal wavelength, $\lambda_s$, while transmissive of the pump wavelength, may further include means to block any signal wavelength from interfering with the operation of laser pump 22 such as, for example, a dichoric mirror positioned between grating 24 and pump 22 permitting transmission of the pump light but effectively reflective of all signal light so as not to interfere with the pump laser 22. This same means may also be employed in connection with any of the subsequent embodiments with regard to these double pass amplifiers.

The advantage of system 10 is that high amplification of laser diode signals that can be varied in pulse width and shape is achieved with high rejection of ASE. The incorporated gratings, such as grating 24, reduce ASE encountered with each pass through double pass amplifier 26. Forward propagation ASE is lost at grating 24 in the fiber. As previously mentioned, backward propagating ASE is also eliminated between ports 20A and 20B because OC 20 effectively isolates fibers 18 and 20 from one another.

Reference is now made to FIG. 2 to illustrates a more detail embodiment of FIG. 1. Pulsed semiconductor laser high power fiber amplifier system 30 comprises a fiber pre-amplifier 38 having a single mode fiber doped with rare earth active element, e.g., a $Yb^{3+}$ doped amplifier. Signal source 32 is modulated to provide a pulse stream on its output, $\lambda_s$, for input to amplifier 38. As an example, the source 32 may be a modulated InGaAs laser diode with a wavelength of 1110 nm with selected pulse widths within the range of about 20 nsec to about 100 nsec and may have a low duty cycle of about 1%. The wavelength of the modulated signal, $\lambda_s$, is within the gain emission spectrum of the rare earth active element in the core of amplifier 38, as is known in the art. Pump source 12 for pre-amplifier 38 is typically a semiconductor laser source, e.g., operating at 980 nm, or a fiber laser pump, e.g., operating at 1064 nm, which is coupled to amplifier 38 via WDM coupler 37 to provide a pump input within the absorption emission spectrum of the rare earth active element of the doped core, as is known in the art.

System 30 differs from system 10 of FIG. 1 with the inclusion of a combination of spectral and temporal filtering eliminating the need for any more costly laser diode signal source isolation such as isolator 13. This filtering comprises a narrow band WDM device 34 to reject higher frequency ASE feedback noise so as not to interfere with the operation of laser signal source 32, and fiber delay line 36 may have a period, $\tau > 100$ nsec. to prevent distortion and feedback effects. The fiber delay line length (and therefore its period) relative to the reflection return pulse via the line depends, of course, on the repetition rate of laser source 32. As an example, if the modulation rate is 100 kHz, a reflection return pulse every 100 nsec will reach source 32 when it is in its OFF time period. Thus, delay line 36 can be designed such that reflection return pulses in the form of spurious noise from forward optical components can be made to return to source 32 at times when the modulated source is in an OFF time period of its operated pulse cycle. In other words, the fiber length for line 36 is chosen such that any amplified feedback will occur when modulated laser diode 32 is in its modulated OFF periods. Delay line 36 may, therefore, have time period of $\tau=100$ nsec. which is 100 to 1,000 times that of the OFF times of the low duty cycle of source 32. The duty cycle of source 32 may be 1% to 20%, for example. The use of isolator 13 is generally greater than 10 times more in cost than the use of a delay line 36 which is merely a length of optical fiber.

Narrow band WDM device 34, coupled between laser source 32 and delay line 36, is optional and rejects any backward cw ASE developed from fiber amplifier 38 from reaching source 32.

It should be noted that, rather than a narrow band WDM device 34, a broad band grating may be employed to cause laser diode source 32 to operate in multiple longitudinal modes, aiding in suppressing SBS in the first stage power amplifier 38. SBS is developed independently in both the first and second amplifier stages 36 and 46. A single mode laser source 32 with have an associated SBS threshold which threshold can be increased by the number of multiple longitudinal operating modes created in source 32. Thus, if a fiber Bragg grating is provided at 34 to have a reflection bandwidth that cause laser source 32 to operate in four longitudinal modes, the SBS threshold will be increased about four times of the basic wavelength of operation of source 32. The long cavity length of delay line 36 may, itself, cause a large number of longitudinal modes to run, significantly increasing the SBS threshold.

Conventionally, laser source 32 provides a more square shaped modulated output and reshaping of the pulse to be of a desired contour which is not possible with YAG laser systems which can only produce a Gaussian-like pulse. It is more desirable in many material processing applications that that the desired heat generated by the laser pulse be immediate and not limited by a gradual ON-sloped Gaussian-like pulse. The features of changing pulse width and pulse shape or contour are not selectively possible in the prior art gas or laser rod technologies, and are particularly useful features in material processing applications, such as fine micromachining, such as new applications of drilling micro holes in airplane wings fro improved air flow over the wings resulting in significant fuel savings and texturing of magnetic disk substrate to prevent stiction of the magnetic head, as discussed later herein, because the reproducibility of desired material removal amounts with duplicated end or edge refinement or textured parameters can be more precisely controlled which was not possible with laser systems of the prior art, such as employing either $CO_2$ or Nd:YAG laser systems. Presently these gas and solid state laser systems are used in many material processing applications and the use of fiber amplifier sources modulated by a semiconductor laser offers lower costs, smaller beam footprint, higher efficiency, improved reliability and improved productivity.

Returning now to the description of FIG. 2, the remaining portion of system 30 is basically identical to that shown in FIG. 1. The output of amplifier 38 is coupled to the input port 20A of a three port optical circulator (OC) 40, which is a commercially available device that functions as a multiport input/output coupler with optical isolation provided between ports. Input/output port 40B of OC 40 is coupled to one end of a two pass, high power fiber amplifier 46 comprising a double clad optical fiber having a core doped with rare earth active element, e.g., a $Yb^{3+}$ doped amplifier. The other end of amplifier 46 is coupled to a high reflectance (HR) fiber grating 44 which has a peak reflectivity at wavelength, $\lambda_s$, e.g., equal to 1110 nm. Grating 44 prevents the passage of pulses, $\lambda_s$, toward pump laser source 42 employed for pumping amplifier 46 via its pump cladding, as is known in the art. Pump source 42 is typically a semiconductor laser diode, but could also be a fiber laser source, and has a wavelength that is transparent to grating 44 but falls within absorption emission spectrum of fiber amplifier 46. Modulated pulse signal, $\lambda_s$, enters amplifier 46 via port 40B and is amplified by the gain of the amplifier after which the signal is reflected by grating 44 back through amplifier 46 where it is amplified again and exits this branch of OC 40 to OC output port 40C providing a high power pulsed signal on output 48.

Examples of operating powers and repetition rates of systems of this invention, previously and yet to be discussed, comprise a modulated laser source with pulse widths of about 10 nsec to about 100 nsec and capable of being modulated at repetition rates between 10 kHz and 100 kHz or more providing a system output power in the range of about 10 μJ to about 100 μJ. The μJ amplified pulse output of the systems disclosed herein have high adaptability for many material processing applications involving the thermal or physical treatment of metals, ceramics or glasses. Also, the pulsed amplifiers described are Yb doped operating in the range of about 1060 to about 1120 nm. However, other rare earth doped fibers may be employed for these amplifiers, previously and yet to be discussed, such as, for example, Er and Er:Yb doped fiber amplifiers operating in the range of about 1520 nm to about 1620 nm.

Reference is now made to the embodiment shown in FIG. 3 comprising pulsed semiconductor laser fiber amplifier system 50. System 50 is basically the same as system 10 in FIG. 1 except for coupler 56 and fiber gratings 54 and 52.

Therefore, like components carry the same numerical identification so that the description for these components in FIG. 1 are equally applicable here and their description is, therefore, not repeated here. Instead of employing WDM coupler 34 in FIG. 2, a 3 dB or other ratio coupler 52 is employed with gratings 54, 56 provided in respective coupler terminated arms 51 and 53. Gratings 54 and 56 each have a peak reflection wavelength, $\lambda_s$, such as $\lambda_s$=1110 nm as in the case of the previous embodiment. These gratings will also keep the diode source 12 frequency locked and any backward propagating ASE from pre-amplifier 18 will be split into the two arms 51 and 53 and lost without being reflected towards and interfering with the operation of modulated laser source 12.

It should be noted that in the disclosed embodiments of this application, three-port optical circulators have been illustrated. However, it is readily understood that larger numbered multi-port optical circulators may be employed for purposes of scaling power to higher levels. As an example, the presently utilized nine-port optical circulators for 1550 nm communication systems can be considered for utilization in these embodiments with additional multi-stage double pass amplifiers provided among the several additional ports. Moreover, the optical circulators have been disclosed in connection with the second, power fiber amplifier stage of the multistage fiber amplifier delivery system of this invention. Such circulators are presently limited in their abilities to withstand higher average powers. However, such inabilities will be short-lived, with their power capabilities presently being be improved. Further, it is within the scope of this invention to use an optical circulator in the first preamplifier stage of the system, such as in the case of amplifiers 18 and 38 of FIGS. 1 and 2. Therefore, there may be a multiport optical circulator, such as in FIG. 1, with its input port connected to signal source 12, a second port connected to a first stage, double pass fiber amplifier (in lieu of amplifier 16), and a third port coupled to a second stage power amplifier as an output, such as shown in FIG. 4, discussed below. Alternatively, the third port, second stage power amplifier, functioning as a second stage double pass amplifier, may be coupled to a circulator fourth port which is the output of the system. Another variation of this scheme is a first and second multiport optical circulator each with at least one double pass fiber amplifier, the output port of the first circulator coupled to the input port of the second circulator and the first port of the first circulator receiving the pulsed input from the modulated semiconductor laser source and the last port of the second circulator being the high power, pulsed output of the system. The advantage of this latter scheme is the rejection of backward propagating ASE buildup in and between the circulator stages and from affecting the laser source.

FIG. 4 illustrates a further modification of the first embodiment as disclosed in pulsed semiconductor laser high power fiber amplifier system 60. In system 60, the pulsed input, $\lambda_s$, from source 12 is coupled to a first port 62A of a three port circulator 62. Circulator 62 has a second port with a double pass first pre-amplifier 64 and a third stage single pass power amplifier 66 to the output. Pre-amplifier 64 may be, for example, a Yb doped fiber with a HR grating 64A at its end for reflection of peak wavelength, $\lambda_s$, and terminal AR coating to prevent reflection of wavelengths transparent to grating 64A, such as backward propagating ASE. Pre-amplifier 64 is pumped by laser source 63 at $\lambda_p$, coupled via fused biconical coupler 67A with a pump reflection grating 63A at the peak wavelength, $\lambda_p$, coupled via fused biconical coupler 67B at the input side of the pre-amplifier. The double amplified output of pre-amplifier 64 is coupled back into port 62B as input via port 62C of the second stage single pass power amplifier 66. Amplifier 66 may be, for example, a Yb doped fiber pumped by laser source 65 at $\lambda_p$ coupled via fused biconical coupler 68A with a pump reflection grating 63A at the peak wavelength, $\lambda_p$, coupled via fused biconical coupler 68B at the output side of the pre-amplifier.

Reference is now made to a second embodiment of this invention illustrated in FIG. 5, which is substantially identical to the embodiment of FIG. 1 except that a four port optical circulator is employed rather than a three port optical circulator and, further, two dual core power fiber amplifiers are employed. The advantage of this system is that one isolator in the form of an optical circulator eliminates the need for several optical isolators and the employment of four fiber amplifiers to achieve high power is reduced to two amplifier stages comprising double pass fiber amplifiers. Pulsed semiconductor laser high power fiber amplifier system 80 comprises two stage, dual pass amplifiers 86 and 96 to provided combined amplifier power at output 99 with the advantage of substantially eliminated ASE from the system. System 80 comprises input, modulated pulses, $\lambda_s$, of a predetermined repetition rate as provided by pulse width and shaping circuit 81 to semiconductor laser source 82, as previously explained, and the pulse stream is coupled into input port 90A of four port optical circulator 90 via optical fiber 84. As taught in the first embodiment shown in FIG. 2, a grating may be employed in fiber 84 to suppress backward ASE as well as provide for multimode operation of source 82 to provide for a higher threshold for SBS. Moreover, a delay line may be employed in fiber 84 to eliminate feedback noise in the operation of source 82 a previously explained. The peak wavelength of modulated pulses, $\lambda_s$, are within the gain emission bandwidth of the first and second stage amplifiers 86 and 96. The pulse stream enters one end of a first stage amplifier 86 at port 90B comprising a double pass multi-mode fiber amplifier with a core doped with a rare earth active element, e.g., a Yb$^{3+}$ core doped fiber amplifier. The other end of amplifier 86 is coupled to a high reflector (HR) fiber grating 88 which has a peak reflectivity at wavelength, $\lambda_s$, and rejects forward propagating ASE buildup in loss through the fiber. Grating 88 prevents the passage of pulses, $\lambda_s$, toward pump laser source 87, which is employed for pumping amplifier 86 via its pump cladding. Pump source 87 is typically a semiconductor laser diode, but could also be a fiber laser source, and has a wavelength that is transparent to grating 88 but within absorption emission spectrum of fiber amplifier 88. Thus, modulated pulse signal, $\lambda_s$, enters amplifier 86 via port 90B and is amplified by the gain of the amplifier after which the signal is reflected by grating 88 back through amplifier 86 where the signal is again amplified with minimal insertion loss, and exits this branch of OC 90 via port 90B and propagates to the next or second stage amplifier 96 and enters at port 90C comprising a double pass multi-mode fiber amplifier with a core doped with a rare earth active element, e.g., a Yb$^{3+}$ core doped fiber amplifier. The other end of amplifier 96 is coupled to a high reflector (HR) fiber grating 98 which has a peak reflectivity at wavelength, $\lambda_s$, and rejects ASE buildup in loss through the fiber. Grating 98 prevents the passage of pulses, $\lambda_s$, toward pump laser source 97, which is employed for pumping amplifier 86 via its pump cladding. Pump source 97 is typically a semiconductor laser diode, but could also be a fiber laser source, and has a wavelength that is transparent to grating 98 but within absorption emission spectrum of fiber amplifier 98. Thus, modulated pulse signal, $\lambda_s$, enters amplifier 96 via port 90C and is amplified by the gain of the amplifier after which the signal is reflected by grating 98 back through amplifier 96 where the signal is again amplified with minimal insertion loss, and exits this branch of OC 90 via port 90C and propagates to output port 90D and thence is provided as an amplified modulated signal on output fiber 99. The advantage of system 80 is that the modulated pulse signal, $\lambda_s$, is reflected back through the same fiber for double pass amplification in stage amplifiers 86 and 96 with minimal insertion loss while providing an amplified signal of as much as 40 dB, i.e., 20 dB for each pass through each amplifier 86 and 96. The fiber gratings 88 and 98 have the advantage of reducing the ASE encountered with each pass through the fiber amplifier 86 or 96. Forward propagating ASE is eliminated at gratings 88,98 through loss in the fiber. Backward propagating ASE is also eliminated between the stages because OC 90 effectively isolates ports 90B and 90C relative to backward light propagation. Gratings 88 and 98, as well as fiber gratings in previous embodiments, are normally formed in the fibers of amplifier stages 86 and 96 by UV exposure and masking, or by holographic techniques. However, these gratings can be formed in separate fibers and then subsequently fiber spliced to the ends of their respective amplifier stages.

As previous indicated in connection with the embodiment of FIG. 3, a multi-port optical circulator with ports, greater in number than three, may be employed with a series of coupled double pass double clad amplifiers, such as, for example, for optical circulators with four to nine ports. Also, a plurality of optical circulator stages with multi-port-coupled double clad fiber lasers may be cascade-coupled, i.e., the output of the previous optical circulator stage may be coupled as the input to the next succeeding optical circulator stage and so on, forming a series of coupled circulator stages providing a scaled power at the final output according to, $$P_{TOTAL} = P_0 \frac{1-(1-S)^N}{S},$$

where $P_0$ is the additive power per stage, S is the insertion loss between stages, and N is the number of circulator stages.

As previously indicated, the $\mu$J amplified pulse output of systems 10, 30, 50 and 80, as well as systems to be yet discussed, have high adaptability for many material processing applications involving the thermal and physical treatment of metals, ceramics or glasses with substantially pulse-to-pulse uniformity in amplitude, shape and contour. One such a application is the texturing of metal substrate surfaces prior to applying a thin magnetic film to the textured surface to produce a magnetic recording disk. Previous systems utilizing laser texturing, as set forth previously in the discussion in the Background of the Invention, employ large laser systems, particularly Nd:YAG lasers, to provide the necessary power to texture the metal substrates for magnetic disk media. To improve the ware resistance of the disk and consistent magnetic properties of the formed magnetic media, the disk surface should be as smooth as possible. However, as previously mentioned, the smooth disk surfaces create a problem known as "stiction" which is the condition where the air-bearing slider of the magnetic recording disk drive traveling over the surface of the magnetic medium tends to stick to the surface, particularly after the slider has been stationary on the disk surface for a period of time. In Contact Start/Stop (CSS) disk drive systems, dedicated textured landing zones for slider parking are utilized to avoid stiction. The causes of stiction and how texturing is accomplished using pulsed laser radiation from such lasers, such as Nd:YAG laser systems, is disclosed in U.S. Pat. No. 5,108,781. To eliminate the effects of stiction, therefore, the metal disk surface, prior to applying the thin magnetic film, is laser textured, i.e., a plurality of grooves, bumps, creators and/or other surface perturbations are formed to produce a roughened disk surface over which the magnetic thin film is deposited or coated. Systems 10, 30 and 50 may be particularly design to provide the texturing by forming micro bumps on the surface of the disk to allow closer tolerances of the magnetic read/write head slider to the surface of the disk through achievement of better pulse stability of the laser source which is achieved by the semiconductor/fiber amplifier pulse delivery systems of this invention and not readily possible with previous YAG laser systems, as previously indicated.

FIG. 6 illustrates a texturing system comprising pulsed semiconductor laser high power fiber amplifier system of this invention including a fiber pre-amplifier and fiber power amplifier, as shown in the embodiments herein, coupled to a star coupler 70 or a beam splitting arrangement dividing the output beam from the system output into multiple beams for presentation to the surfaces of disk substrates 75A–75E to be textured via single mode fibers 73 and 74, one for treatment of the upper surface of the disks and the other for treatment of the lower surface of the disks as shown. Five disks are disclosed in FIG. 6 for treatment, but the number of disks that can be treated is governed by the power from the laser system, as beam divided, to produce separate treatment beams of sufficient power level to enable texturing of the chosen material for the disk substrates, such as, for example, aluminum, AlMg, glass or ceramic. A specific example in connection with a single disk, such as, for example, disk substrate 75A, is to split the output beam of 0.58 mm diameter, wavelength of 1064 nm and pulse energy of about 4 $\mu$J into two beams that are targeted to both sides of the disk, as shown in FIG. 5 via fibers 73 and 74, which are then expanded to 4x and focused to the disk surfaces as 10 $\mu$m spots, which spot sizes can be varied. The pulse rate of the modulated output beam may be in the range of 30 kHz to 1000 kHz and may be easily varied by electrically controlling the modulation of semiconductor laser 12, 32. The pulse width and pulse shape may also be varied with circuit 11, 31 for semiconductor laser 12, 32 within a pulse-width range, for example, of about 10 nsec to about 200 nsec and having pulse shapes that are square in nature, rather than Gaussian-like and stepped or ramped up and/or stepped or ramped down time variations. Improved long term pulse-to-pulse energy stability below 1% rms. is realized by the use of the pulsed semiconductor laser high power fiber amplifier system of this invention, such as, for example, in the range of 0.1% rms to 0.5% rms (prior art YAG systems are in the range of about 1% to 2% rms). Prior art systems are not capable of such low rms percentages and resulting stability nor are they capable of independent pulse width and repetition rate variation, selectivity and setting, achievable in a comparatively more compact, smaller size, semiconductor/ fiber amplifier pulse delivery system of this invention. Because of the use of fiber amplifiers operating in saturation, the reproducibility of identical pulse in the modulated pulse stream is much improved over that of the prior art YAG laser systems.

In the operation of the apparatus of FIG. 6, the disk substrates 57A–57E are simultaneously rotated on a shaft 76 by means of a motor (not shown) and the entire assembly is capable of radial translation by separate translation means (not shown). In synchronism with disk rotation and their radial translation, modulated pulses from pulsed semiconductor laser high power fiber amplifier system are launched into star coupler 70 where the pulse energy is divided into separate beams which are respectively delivered for upper and lower surface treatment of disks 57A–57E by means of optical delivery fibers 73 and 74 concurrently texturing the surfaces of disk 57A–57E as the same are continuously rotated and translated. As is known to those in the surface texturing art, texturing of the disk surfaces is controlled by the combination of pulse energy, spot size, pulse rate, pulse width, disk rotation speed and disk translation rate. Also, the surface energy fluence is an important consideration and is controlled in this invention by means of pulse shaping which cannot be done successfully with YAG lasers. With the use of electronic circuits 11 and 31, pulse shaping can be realized for forming different pulse Gaussian profiles that are proper for the desired energy fluences at the surfaces of selected disk substrate materials to be textured.

The foregoing embodiments provide for high power pulsed amplifiers having cladding pumped fiber amplifiers in the signal carrying path. The configurations of FIGS. 7–9 separate out the cladding pumped fiber power generating step from the fiber amplifying portion so that all the amplification takes place in a single mode fiber. The advantages of such a configuration is that it is easier to suppress Raman nonlinear conversion such as winding the amplifier single mode fiber on a small diameter spool. Further, a linear amplifier configuration can be implemented particularly since isolators, such as 1100 nm isolators, are presently easier to obtain than circulators. Third, single mode fibers to form a multistage amplification system are much easier to fusion splice. Fourth, it is easier to produce, with reproducibility, than in double clad fibers. Fifth, by separating out the double clad laser as a pumping source, it permits independent optimization of the double clad laser from the operating characteristics of the fiber amplifier system. Sixth, single mode fiber core has a higher numerical aperture which is important for high gain preamplifier or first stage of the fiber amplifier system. While feedback from the amplifier system back into the fiber laser may be a problem, the employment of an all-fiber grating system will substantially eliminate any noise in a manner previously explained in connection with double pass amplifiers in earlier explained embodiments. While more earth doped fiber may be required for these embodiments, the cost is not significantly different because single mode fibers for the amplifiers is less expensive than double clad fibers used for the second stage amplifier.

Reference is now made to a third embodiment of this invention shown in FIG. 7 illustrating high power laser optical amplifier system 100. System 100 comprises a semiconductor laser 102 modulated by circuit 101 to provide a signal to first or preamplifier stage 105 via optical isolator 103 to prevent feedback from destabilizing laser source 102. The output of first stage amplifier 105 is coupled to a second stage power amplifier 108 and the first stage is isolated from ASE and other feed-back noise from second stage 108 by means of isolator 106. As a specific example, diode source 102 may be a laser diode operating at 1090 nm and first and second stage amplifiers 105 and 108 may be single mode fibers doped with Yb. Pump source 109 provides pump power via coupler 110 to both amplifier stages 105 and 108 via 50/50 coupler and couplers 104, 107, respectively. Pump 109 may be a semi-conductor laser or MOPA device but is shown here as a fiber laser, such as a Yb doped fiber laser, to provide pump power at, for example, a pumping wavelength of 1064 nm. Fiber laser 109 is double clad, diode pumped fiber which provides high power output for pumping both amplifier stages 105 and 108. It should be noted that coupler 110 need not split the power equally between stages 105 and 108 as the power split can be accomplished to permit saturation of stage 105 with more of the pump power provided to stage 108. Also, time delay fiber 34 of FIG. 2 may be utilized in this embodiment in lieu of isolator 103.

Reference is now made to a fourth embodiment shown in FIG. 8 comprising high power laser optical amplifier system 120. System 120 is similar to system 100 except that the pump power is provided to the first and second amplifier stages in a different manner. System 120 comprises a semiconductor laser 122 modulated by circuit 121 to provide a signal to first or preamplifier stage 125 via optical isolator 123 to prevent feedback from destabilizing laser source 122. The output of first stage amplifier 125 is coupled to a second stage power amplifier 128 and the first stage is isolated from ASE and other feedback noise from second stage 128 by means of isolator 126. As a specific example, diode source 122 may be a laser diode operating at 1550 nm and first and second stage amplifiers 125 and 128 may be single mode fibers co-doped with Er:Yb. Fiber laser pump source 129 comprises a Yb pump fiber with an AR coating at its terminal end and spaced feedback gratings 132 for providing stimulated emission having a wavelength, for example, of 1065 nm, providing pump power via WDM coupler 120 to both amplifier stages 125 and 128 via coupler 127 to second stage amplifier 128, and via bypass line 124, by-passing isolator 126, and associated couplers 124A and 124 B to first stage amplifier 125. This configuration provides the advantage of employing a single fiber pump laser 129 to provide pumping power for both amplifier stages.

Reference is now made to a fifth embodiment shown in FIG. 9 comprising high power laser optical amplifier system 140. System 140 is similar to system 120 shown in FIG. 7 except that the first stage amplifier is pumped with separate pump source. System 140 comprises a semiconductor laser 142 modulated by circuit 141 to provide a signal to first or preamplifier stage 145 via time delay fiber 143 to prevent feedback from the first and second stages from destabilizing laser source 142. The output of first stage amplifier 145 is coupled to a second stage power amplifier 148 and the first stage is isolated from ASE and other feedback noise from second stage 148 by means of isolator 146. As a specific example, diode source 142 may be a laser diode operating at 1110 nm and first and second stage amplifiers 145 and 148 may be single mode fibers doped with Yb. Alternatively, first and second stage amplifiers 145 and 148 may be double clad fibers, or first stage amplifier 145 may be a single mode fiber and second stage amplifier 148 may be a double clad fiber. A pump laser 148 is coupled to the first stage amplifier 145 via coupler 144 while second stage 148 is pumped by a separate pump laser 149 coupled via coupler 147. Pump laser 148 may be a laser diode operating at 980 nm, a readily available pump laser diode in the market place, to pump pre-amplifier stage 145. Pump laser 149 may be the same as fiber laser 129 in FIG. 8. Semiconductor laser 148 is sufficient to pump first stage 145 but provides a problem that it will produce gain at low point in the absorption band for Yb at about 1110 nm, whereas in an Yb doped fiber, maximum gain is approximate to about 1030 nm to 1040 nm. However, by providing fiber gratings 145A, 145B (grating 145A being highly reflective and grating 145B being lower reflectivity to permit substantially all light to pass to the second stage) in fiber amplifier stage 145 each having a reflective band in the range of around 1040 nm, for example, the circulating pump light in the first stage 145 with drive the gain towards these longer wavelengths within this range for efficient amplification at a wavelength more acceptable to absorption of the pump light.

Also, shown in FIG. 9 is time delay fiber 143 between laser diode 142 first stage amplifier 145 eliminating the need for a optical isolator. If the fiber length is selected so that the round trip time is greater than 100 nsec, the diode will be off before any backward propagating ASE or SBS from either or both amplifier stages 145 and 148 reaches laser diode 142 destabilizing its operation.

Since Yb single mode fibers are available with a wide range of numerical apertures, the single mode fibers utilized for the two different amplifier stages in the embodiments of FIGS. 6–8 can be separately optimized for the high-gain preamplifier (first stage) and low power amplifier (second stage) and fusing together the two single mode fibers. In one case, the use of different NA fibers will provide for different Brillouin shifts as well as significantly raise the SBS threshold. Furthermore, the Raman threshold can be significantly increased by several orders of magnitude by tightly winding the single mode fiber on a core introducing a significant bend loss at the Raman shifted wavelength.

Reference is now made to FIGS. 10–13 which illustrates different pulse configurations that are possible in the application of this invention as developed from the modulation circuits. Such circuitry is known in the electronic art. Many other pulse widths and shapes are possible but too numerous to provide herein but the pulse configurations here illustrate basic ones wherein the initial stages of the pulse are either of high or low amplitude progressing to or ending up with lower or higher amplitudes, respectively. Variations and combinations of such pulses can be easily visualized, such as a high-low-high pulse amplitude, with corresponding change sin their pulse shapes, such as in the change of amplitude instantaneous or over time. In FIGS. 10 and 11, the pulse starts with a high amplitude and is reduced to lower amplitude. In FIG. 10, the pulse is turned ON with peak power 160 and is reduced to a lower value 162 before it is extinguished. This particular pulse configuration has utility in welding applications by creating a plasma and flash heating of the point of welding, via peak power portion 160, followed by a lower pulse level to perform the weld itself. In FIG. 11, instead of instantaneous turn ON, the pulse has an initial rise time 164 monotonically increasing to a peak power 165 after which is montonically reduced at 167 in power level to a second level 168 after which the pulse is extinguished by a terminal ramp turn OFF portion 169. In FIGS. 12 and 13, the pulse starts with a low amplitude and is increased to a higher amplitude or amplitudes. In FIG. 12, the pulse is stepped to a first level 170, thence to a second higher intermediate level 171, and thence to a highest level 172 before it is extinguished. In FIG. 13, instead of instantaneous turn ON, the pulse has an initial rise time 174 monotonically increasing to a first level 175 and then a monotonic increase at 176 to a highest level 177 before it is extinguished.

Reference has been to the utility of the high power laser optical amplifier system comprising this invention to modification of materials, such as organic materials (e.g., polymeric), ceramic and metals for modification through surface texturing, heat treatment, surface engraving or fine micro-machining, surface ablation, cutting, grooving, bump forming, coating, soldering, sealing, surface diffusion and surface conversion to a compound. These different treatments will now be briefly explained in connection with the use of the high power laser optical amplifier system of this invention. Surface texturing has already been discussed. The system of this invention can be applied as a heat treatment of materials, such as conversion to a different form either physical or chemical such as by incorporation of another component or compound or dopant. Surface engraving can be performed features and images on a surface such as in the case of a gravure roller. Surface ablation is performed to remove material from a surface with precision detail such as in the case of ablation imaging forming lithographic plates to physically transform a surface layer as taught in U.S. Pat. No. 5,385,092. The system of this invention may also be employed in cutting through or forming precision holes in an aligned manner in metal and nonmetal materials or forming grooves in metals or ceramic or semiconductor materials such as in a step to form channels for further CVD growth on a patterned surface form by the system of this invention. Bump forming is the process of precision ablating a surface to form a roughen texture. Also, the system may be used to apply a laser beam to a surface for raising the surface temperature of the material for rotation coating or for apply another material to the surface to bond with and coat the heated surface. The system of this invention may be employed to solder metal materials or seal together two surfaces or fill a void with molten material. An example of soldering is the employment of a series of two step pulses that have a first stage comprising an initial high, sharp amplitude to initially for a plasma to enhance absorption of light followed by a second stage of lower amplitude to melt the solder material and perform the function of soldering. Such a technique can also employed for sealing together polymer materials such as mending and merging together two adjacent outer polymer claddings of an optical fiber or a glass planar optical waveguide. Surface diffusion involves the selective diffusing of a material on a surface into the surface by applying heat to selective regions or in a pattern of the surface. The material to be diffused may be a dopant or other impurity or may be a material such as a metal (Al) or nonmetal (Si) that is selective melted with the underlying surface to form a surface compound in an area or pattern.

Although the invention has been described in conjunction with one or more preferred embodiments, it will be apparent to those skilled in the art that other alternatives, variations and modifications will be apparent in light of the foregoing description as being within the spirit and scope of the invention. While the discussion herein has been directed to one or more coupled, double clad or multi-mode fiber amplifiers, it is within the scope of this invention to employ a plurality of fiber lasers, each coupled to a respective port of a multi-port optical circulator, such as in place of the double clad or multimode amplifier(s) in FIGS. 1 or 5 or the series connected amplifiers in FIG. 8. Also, while reference has been to particular fiber amplifiers or pump lasers, such as Yb or Er:Yb co-doped amplifiers, it is known to those skilled in the art that other rare earth dopant elements or combinations thereof may be used instead of these particular examples with corresponding signal and pump wavelengths operative within the gain spectrum of such dopants. Therefore, this invention is not intended to be confined to the specific gain element employed in the disclosed embodiments. Thus, the invention described herein is intended to embrace all such alternatives, variations and modifications that may fall within the spirit and scope of the following claims.

What is claimed is:

1. A high power laser optical amplifier system comprising:

a laser source for providing at its output a signal having a peak wavelength, $\lambda_s$;

a fiber amplifier coupled to receive said signal output for amplification;

the improvement comprising a WDM device coupled between said fiber amplifier and said laser source for rejecting backward propagating ASE from said amplifier and redirecting it so as not to enter into said laser source.

2. The high power laser optical amplifier system of claim 1 wherein said fiber amplifier is a first stage fiber amplifier and further comprising a second stage fiber amplifier coupled to receive the amplified signal from said first stage amplifier for further amplification; and means for rejecting ASE buildup in said second stage amplifier from backward propagating into said first stage amplifier.

3. The high power laser optical amplifier system of claim 2 wherein said ASE rejection means comprises an optical circulator, said first stage fiber amplifier coupled to one port of said circulator and said second stage fiber amplifier coupled to another port of said circulator.

4. A high power laser optical amplifier system comprising:

a laser source for providing at its output a signal having a peak wavelength, $\lambda_s$;

a fiber amplifier coupled to receive said signal output for amplification;

the improvement comprising an optical fiber coupler coupled between said fiber amplifier and said laser source for rejecting backward propagating ASE into said laser source;

said fiber coupler having at least one terminal port for accepting backward propagating ASE, and a reflector formed at said port having a peak wavelength, $\lambda_s$.

5. The high power laser optical amplifier system of claim 4 wherein said reflector has a sufficiently broad bandwidth to cause said laser source to operate in multiple longitudinal modes increasing the SBS threshold of said fiber amplifier.

6. The high power laser optical amplifier system of claim 4 wherein said reflector is a fiber grating.

7. A high power laser optical amplifier system comprising:

a laser source for providing at its output a signal having a peak wavelength, $\lambda_s$;

a first fiber amplifier coupled to receive said signal output for amplification;

a filter coupled between said fiber amplifier and said laser source for rejecting backward propagating ASE into said laser source;

a second stage fiber amplifier coupled to receive the amplified signal from said first stage amplifier for further amplification;

means for rejecting ASE buildup in said second stage amplifier from backward propagating into said first stage amplifier;

at least one of said stage fiber amplifiers comprising a double pass amplifier having a first end for receiving said signal for amplification and a second end coupled to a reflector having a peak reflection at $\lambda_s$, said reflector coupled to a pump source having a peak wavelength, $\lambda_p$, suitable for pumping said double pass stage fiber amplifier and wavelength transparent to said reflector.

8. The high power laser optical amplifier system of claim 7 wherein said ASE rejection means comprises an optical circulator, said first stage fiber amplifier coupled to one port of said circulator and said second stage fiber amplifier coupled to another port of said circulator.

9. A high power laser optical amplifier system comprising:

a modulated laser source for providing at its output a signal of pulses of predetermined period and having a peak wavelength, $\lambda_s$;

a fiber amplifier coupled to receive said pulse signal for amplification;

a spectral filter coupled between said fiber amplifier for rejecting backward propagating ASE into said pulsed signal laser source;

the improvement comprising a fiber delay line coupled between said modulated laser source and said fiber amplifier to prevent said modulated laser source from being affected by return pulses reflected from forward optical components in the system, the fiber delay line length chosen so that the return pulses reach the modulated laser source at pulse OFF times of its predetermined pulse period.

10. The high power laser optical amplifier system of claim 9 wherein said fiber amplifier is a first stage fiber amplifier and further comprising a second stage fiber amplifier coupled to receive the amplified signal from said first stage amplifier for further amplification; and means for rejecting ASE buildup in said second stage amplifier from backward propagating into said first stage amplifier.

11. The high power laser optical amplifier system of claim 10 wherein said first stage fiber amplifier is a single mode fiber amplifier and said second stage is a multimode, double pass amplifier.

12. The high power laser optical amplifier system of claim 10 wherein said ASE rejection means comprises an optical circulator, said first stage fiber amplifier coupled to one port of said circulator and said second stage fiber amplifier coupled to another port of said circulator.

13. The high power laser optical amplifier system of claim 10 wherein said first stage fiber amplifier and said second stage amplifier are both multimode, double pass amplifiers with each having a first end for receiving said signal for amplification, said stage fiber amplifiers having a second end coupled to a reflector having a peak reflection at $\lambda_s$, said reflectors coupled to a respective pump source having a peak wavelength suitable for respectively pumping said stage fiber amplifiers at wavelengths transparent to said reflectors, said signal making a double pass respectively through said stage fiber amplifiers.

14. The high power laser optical amplifier system of claim 13 wherein said ASE rejection means comprises an optical circulator, said first stage fiber amplifier coupled to one port of said circulator and said second stage fiber amplifier coupled to a second port of said circulator, and a signal output from said second stage fiber amplifier coupled to a third port of said circulator.

15. The high power laser optical amplifier system of claim 13 wherein said $\lambda_s$ peak reflectors in said stage fiber amplifiers comprise fiber gratings.

16. The high power laser optical amplifier system according to claim 10 wherein output from said second stage fiber amplifier is applied to material processing.

17. The high power laser optical amplifier system according to claim 16 wherein said material processing consisting of one of surface texturing, heat treatment, surface engraving, surface ablation, cutting, grooving, bump forming, coating, soldering, sealing, surface diffusion and surface conversion to a compound.

18. The high power laser optical amplifier system of claim 10 wherein at least one of said stage fiber amplifiers comprising a double pass amplifier having a first end for receiving said signal for amplification and a second end coupled to a reflector having a peak reflection at $\lambda_s$, said reflector coupled to a pump source having a peak wavelength, $\lambda_p$, suitable for pumping said double pass stage fiber amplifier and wavelength transparent to said reflector.

19. The high power laser optical amplifier system of claim 18 wherein said $\lambda_s$ peak reflector comprises a fiber grating.

20. The high power laser optical amplifier system of claim 9 wherein said fiber amplifier is a single fiber or a double clad fiber.

21. The high power laser optical amplifier system of claim 9 wherein said modulated laser source is a semiconductor laser source.

22. The high power laser optical amplifier system of claim 9 wherein said fiber delay line is of sufficient length to cause said laser to operate in multiple longitudinal modes increasing the SBS threshold of said fiber amplifier.

23. The high power laser optical amplifier system of claim 9 further comprising a modulating circuit for modulating said signal laser source such that the contour of said pulses are varied.

24. The high power laser optical amplifier system of claim 9 further comprising a modulating circuit for modulating said signal laser source such that the width of said pulses are varied.

25. The high power laser optical amplifier system of claim 9 wherein said spectral filter comprises a narrow band WDM device coupled between said signal output and said fiber amplifier.

26. The high power laser optical amplifier system of claim 9 wherein said spectral filter comprises a dB fiber coupler coupled between said signal output and said fiber amplifier and having two terminated ports each with a reflector formed therein having a peak wavelength, $\lambda_s$.

27. The high power laser optical amplifier system of claim 26 wherein said reflectors comprise fiber gratings.

28. The high power laser optical amplifier system of claim 26 wherein said reflectors have sufficiently broad bandwidths to cause said laser to operate in multiple longitudinal modes increasing the SBS threshold of said fiber amplifier.

29. The high power laser optical amplifier system of claim 26 wherein said reflectors are fiber gratings.

* * * * *